(12) United States Patent
Sayyah et al.

(10) Patent No.: US 9,310,471 B2
(45) Date of Patent: Apr. 12, 2016

(54) SINGLE CHIP SCANNING LIDAR AND METHOD OF PRODUCING THE SAME

(71) Applicant: HRL LABORATORIES LLC, Malibu, CA (US)

(72) Inventors: Keyvan Sayyah, Santa Monica, CA (US); Pamela R. Patterson, Los Angeles, CA (US); Oleg M. Efimov, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 13 days.

(21) Appl. No.: 14/317,695

(22) Filed: Jun. 27, 2014

(65) Prior Publication Data

US 2015/0378012 A1    Dec. 31, 2015

(51) Int. Cl.
| | |
|---|---|
| *G01C 3/08* | (2006.01) |
| *G01S 7/481* | (2006.01) |
| *H01S 5/026* | (2006.01) |
| *H01S 5/02* | (2006.01) |
| *H01S 5/12* | (2006.01) |
| *G01S 17/02* | (2006.01) |

(52) U.S. Cl.
CPC ............... *G01S 7/4817* (2013.01); *G01S 17/02* (2013.01); *H01S 5/021* (2013.01); *H01S 5/0215* (2013.01); *H01S 5/0262* (2013.01); *H01S 5/12* (2013.01)

(58) Field of Classification Search
CPC .......................................... G01C 3/08
See application file for complete search history.

(56) References Cited

U.S. PATENT DOCUMENTS

| | | | |
|---|---|---|---|
| 2002/0171901 A1 | 11/2002 | Bernstein | |
| 2005/0286832 A1 | 12/2005 | Witzens et al. | |
| 2006/0227317 A1 | 10/2006 | Henderson et al. | |
| 2007/0036509 A1* | 2/2007 | Kakui | C03C 3/06 385/142 |
| 2009/0154872 A1* | 6/2009 | Sherrer | G02B 6/4248 385/14 |
| 2009/0310459 A1* | 12/2009 | Gage | G11B 5/314 369/100 |
| 2010/0271614 A1 | 10/2010 | Albuquerque et al. | |
| 2011/0019154 A1 | 1/2011 | Jennings et al. | |
| 2011/0164783 A1 | 7/2011 | Hays et al. | |
| 2011/0260036 A1 | 10/2011 | Baraniuk et al. | |
| 2011/0286066 A1 | 11/2011 | Weiss et al. | |
| 2012/0069342 A1 | 3/2012 | Dalgleish et al. | |
| 2012/0120390 A1* | 5/2012 | Fattal | G01S 3/784 356/121 |
| 2012/0170029 A1* | 7/2012 | Azzazy | H01J 31/507 356/139.04 |

(Continued)

OTHER PUBLICATIONS

U.S. Appl. No. 14/317,753, filed Jun. 27, 2014, Owechko.

(Continued)

*Primary Examiner* — Luke Ratcliffe
*Assistant Examiner* — Samantha K Abraham
(74) *Attorney, Agent, or Firm* — Ladas & Parry (57) ABSTRACT

A chip-scale scanning lidar includes a two dimensional (2D) scanning micromirror for a transmit beam and a 2D scanning micromirror for a receive beam, a laser diode and a photodetector, a first waveguide and first grating outcoupler coupled to a front facet of the laser diode, a second waveguide and a second grating outcoupler coupled to a rear facet of the laser diode on a substrate. A first fixed micromirror, a second micromirror, a third micromirror, and a focusing component are in a dielectric layer bonded to the substrate over the laser diode and photodetector. The photodetector is optically coupled to the second fixed micromirror and the third fixed micromirror for coherent detection.

27 Claims, 5 Drawing Sheets

(56) References Cited

U.S. PATENT DOCUMENTS

| | | | |
|---|---|---|---|
| 2012/0236379 A1 | 9/2012 | Da Silva et al. | |
| 2013/0088726 A1* | 4/2013 | Goyal | G01S 7/4866 356/634 |
| 2014/0313519 A1* | 10/2014 | Shpunt | G01S 7/4815 356/612 |
| 2015/0015869 A1* | 1/2015 | Smith | G01S 17/023 356/28.5 |

OTHER PUBLICATIONS

Richard G. Baraniuk "Compressive Sensing", IEEE Signal Processing Magazine, pp. 118-124, (Jul. 2007).

From U.S. Appl. No. 14/317,753, Application and Office Actions.

International Search Report and Written Opinion for PCT/US2014/044741 mailed Mar. 24, 2015.

International Search Report and Written Opinion for PCT/US2014/044745 mailed Mar. 26, 2015.

\* cited by examiner

SINGLE CHIP SCANNING LIDAR AND METHOD OF PRODUCING THE SAME

CROSS REFERENCE TO RELATED APPLICATIONS

This application is related to and claims priority from U.S. patent application Ser. No. 14/317,753, filed Jun. 27, 2014, which is incorporated herein by reference as though set forth in full.

STATEMENT REGARDING FEDERAL FUNDING

None

TECHNICAL FIELD

This disclosure relates to LIght Detection And Ranging (lidar), and in particular scanning lidars.

BACKGROUND

There are a number of commercially available lidar systems that have primarily targeted the automotive application area. Velodyne Lidar, Inc. markets a pulsed lidar—the Velodyne-64E, which has multiple rows of light emitting laser/detector pairs which are mounted on a single axis mechanically rotating stage to provide 360° azimuthal field-of-view (FOV) using a near-IR laser beam with a wavelength of 905 nm and a narrow beamwidth of 0.09°. This prior art lidar has a limited field of view (FOV) in the second dimension of only about 27°, a range resolution of only about 80 cm, a volume greater than 8000 cm$^3$, a relatively heavy weight of greater than 13 kg, a relatively high cost, and relatively slow mechanical scanning.

Another prior art scanning lidar module is made by Ibeo Automotive Systems—the Lux-2010. It is also a pulsed scanning lidar with a mechanically rotating mirror. Similar to the Velodyne lidar, the Ibeo module scans only in one dimension with a horizontal FOV of 110°, and a very limited vertical FOV of about 3°. Although it is more compact relative to the Velodyne system, the Ibeo lidar module is still bulky at greater than 1300 cm$^3$ and still relatively expensive.

Another prior art lidar product is marketed by Advanced Scientific Concepts—the ADC-TigerEye 3D. Unlike the Velodyne and Ibeo lidars, the ADC lidar operates in a pulsed flash mode in contrast to scanning mode and uses pulse triggered 256×256 pixel image sensors to form 3D images. The main disadvantage of this lidar is its limited concurrent FOV and range due to its flash mode of operation. For example, for a range of 60 m, the FOV is 45°×45°, which decreases to a FOV of only 9°×9° for a 450 m range. This module, although more compact than the Velodyne lidar, is still bulky at greater than 1300 cm$^3$ and heavy at greater than 1.5 kg.

What is needed is an improved lidar. The embodiments of the present disclosure answer these and other needs.

SUMMARY

In a first embodiment disclosed herein, a method of fabricating a chip-scale scanning lidar comprises forming a two dimensional (2D) scanning micromirror for a transmit beam on a substrate, forming a two dimensional (2D) scanning micromirror for a receive beam on the substrate, forming a laser diode on the substrate, forming a photodetector on the substrate, forming a first waveguide on the substrate coupled to a front facet of the laser diode, forming a first grating outcoupler on the substrate coupled to the first waveguide, forming a second waveguide on the substrate coupled to a rear facet of the laser diode, forming a second grating outcoupler on the substrate coupled to the second waveguide, forming a first fixed micromirror and a second fixed micromirror in a first dielectric layer, forming a third fixed micromirror in a second dielectric layer, forming a focusing component in a third dielectric layer, bonding the first, second and third dielectric layers together to form a composite structure, aligning the composite structure to the substrate over the laser diode and photodetector, and bonding the composite structure to the substrate over the laser diode and photodetector.

In another embodiment disclosed herein, a chip-scale scanning lidar comprises a substrate, a two dimensional (2D) scanning micromirror for a transmit beam on the substrate, a two dimensional (2D) scanning micromirror for a receive beam on the substrate, a laser diode on the substrate, a photodetector on the substrate, a first waveguide on the substrate coupled to a front facet of the laser diode, a first grating outcoupler on the substrate coupled to the first waveguide, a second waveguide on the substrate coupled to a rear facet of the laser diode, a second grating outcoupler on the substrate coupled to the second waveguide, a first fixed micromirror in a dielectric layer, the first fixed micromirror optically coupled to the first grating outcoupler, a second fixed micromirror in the dielectric layer, the second fixed micromirror optically coupled to the second grating outcoupler, a third fixed micromirror in the dielectric layer the third fixed micromirror optically coupled to the two dimensional (2D) scanning micromirror for the receive beam, and a focusing component in the dielectric layer the focusing component optically coupled to the third fixed micromirror, wherein the photodetector is optically coupled to the second fixed micromirror and the third fixed micromirror for coherent detection, and wherein the dielectric layer is aligned to and bonded to the substrate over the laser diode and photodetector.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1A:
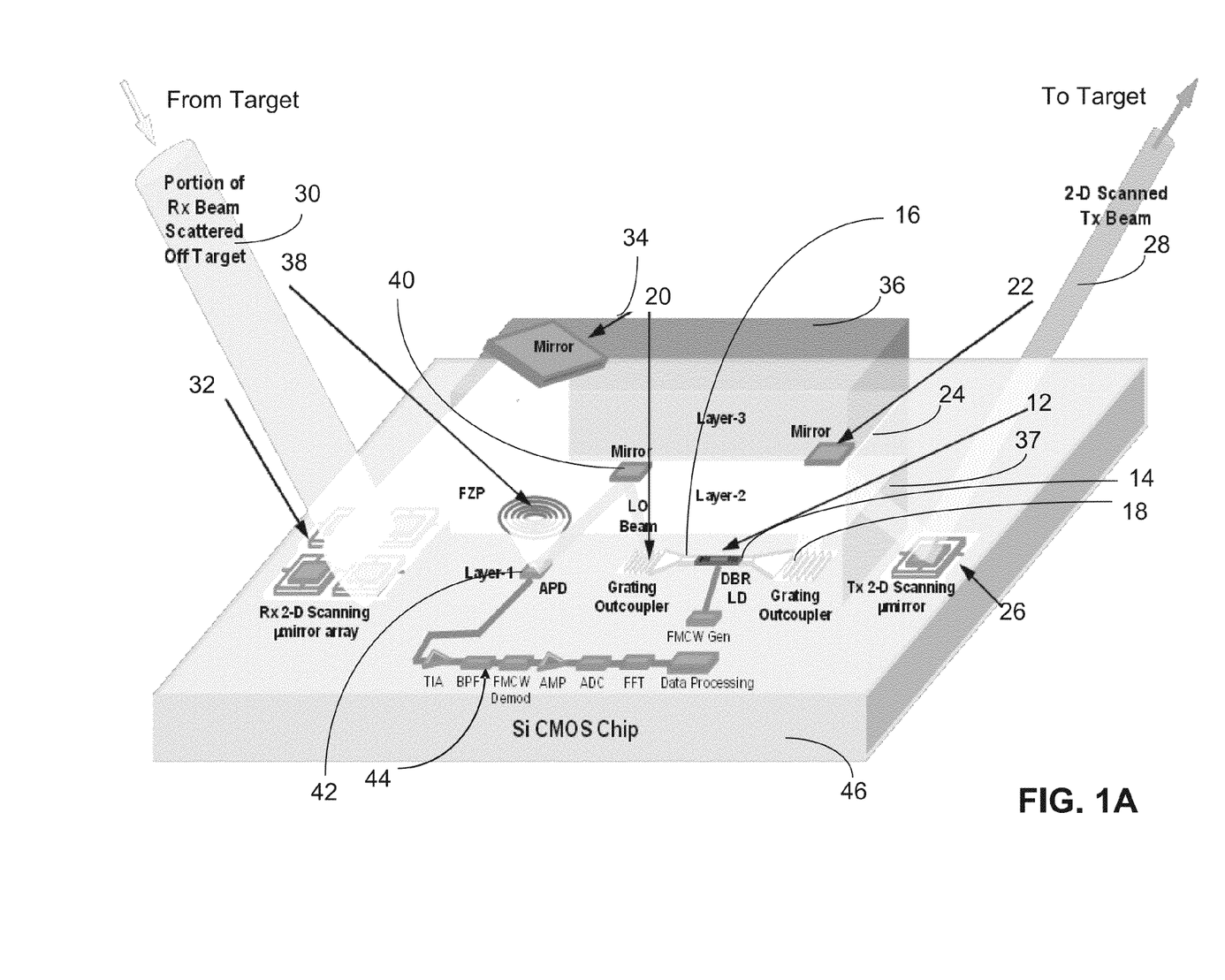
FIG. 1A shows a 3D heterogeneously integrated chip-scale scanning lidar transceiver in accordance with the present disclosure.

FIG. 1A shows a 3D heterogeneously integrated chip-scale scanning lidar transceiver 10 in accordance with the present disclosure. The lidar transceiver 10 has a single mode laser diode 12, which may operate in the ultraviolet, visible, near-IR, and mid-IR, and long wave-IR (LWIR) spectral regions, and waveguide structures 14 and 16 optically coupled to the laser diode 12 at the front facet and the rear facet of the laser diode 12, respectively. The waveguide structures 14 and 16 are transparent at the emitting wavelength of the laser diode 12. Waveguide grating outcoupler structures 18 and 20 are coupled to the end of the transparent waveguides 14 and 16, respectively. The waveguide grating coupler 18 routes an optical beam generated from the front facet of the laser diode 12 to a fixed micromirror 22, which is embedded in a thick dielectric layer 22, which may be plastic. The micromirror 22 routes the optical beam to a single 2D scanning micromirror 26, which transmits transmit beam 28 to a target (not shown).

The receive beam 30, which is a portion of the transmit beam 28 reflected from the target, is received by an array of 2D scanning micromirrors 32. The scanning micromirrors 32 route the received beam 30 to a fixed mirror 34 embedded in a thick dielectric layer 36, such as plastic. The mirror 34 then routes the received optical beam to a focusing micro-optical component 38, which may be a Fresnel Zone Plate (FZP) or a microlens. The focusing micro-optical component 38 focuses the received optical beam on a photodetector 42 responsive to the laser wavelength, which may be an avalanche photodiode (APD).

The waveguide grating outcoupler 20 routes an optical beam generated from the rear facet of the laser diode 12, which may be used as a local oscillator (LO) optical beam, to a fixed micromirror 40, which is embedded in the thick dielectric layer 22. The micromirror 40 routes the LO optical beam to the photodetector 42 for coherent detection of the focused received optical beam from the focusing micro-optical component 38.

Following detection by the photodetector 42, post detection processing may be performed by lidar electronic processing elements and circuitry 44, which may include time averaging, bandpass filtering (BPF), frequency modulated continuous wave (FMCW) demodulation, amplification, analog to digital conversion, fast Fourier Transform (FFT) processing, and data processing. These components may all be integrated on the integrated chip-scale scanning lidar transceiver 10 substrate 46. The substrate 46 is preferably a Si-based substrate 46, although III-V semiconductors such GaAs or InP may also be used.

The laser diode 12, which may preferably be a Distributed Bragg Reflector (DBR) or a Distributed Feedback (DFB) laser, provides the optical power for lidar transmission. The laser diode 12 may be an edge emitting laser structure designed so that a major fraction, which may be greater than 75%, of its generated light power is emitted from the front facet of the laser diode 12, which is the transmit side. The remaining power is emitted from the rear or back facet of the laser diode 12. As discussed above, the backside emitted light can be used as a local oscillator for coherent detection in the photodetector 42.

The operation of the chip-scale lidar 10 is further described as follows. The light emitted from the front facet of the laser diode 12 is coupled to the optical waveguide 14 which terminates in the grating outcoupler structure 18. The waveguide 14, which is preferably formed with low loss dielectric material comprising its core and cladding regions, may be a ridge or a rib waveguiding structure type. The grating outcoupler structure 18 may be formed from the same material as the waveguide 14 and may be designed as a second order grating to outcouple light from the waveguide 14 at close to a normal direction from the substrate 46 to the micromirror 22, as shown in FIG. 1A.

The outcoupled transmit light is then redirected via the fixed static micromirror 22 to the 2D scanning micromirror 26, which directs the transmitted light onto a target.

The received portion 30 of the lidar beam scattered from the target is incident on an array of 2D scanning micromirrors 32, which are synchronized with the scanning micromirror 26 on the transmit side. The array of 2D scanning micromirrors 32 are used to increase the effective receiver aperture, and hence signal-to-noise ratio (SNR), and are synchronized with the transmit micromirror 26 in order to redirect the lidar return signal to the static micromirror 34 in the receive segment of the chip-scale lidar 10 at a fixed angle. The received optical beam is then focused on to a high-speed photodetector 42 using a Fresnel Zone Plate (FZP) 38 or a microlens and coherently combined with the local oscillator (LO) optical beam from the rear facet of the laser diode 12, which is also incident on the photodetector 42. The LO optical beam is directed to the photodetector 42 via the grating outcoupler 20 and the fixed micromirror 40, as shown in FIG. 1A.

Figure 1B:
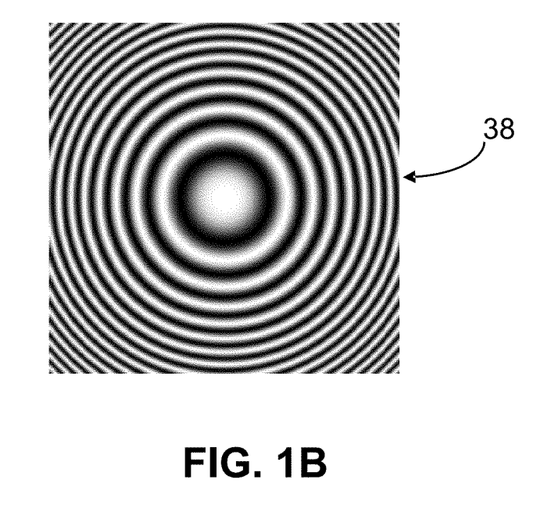
FIG. 1B shows an example of a sinusoidal Fresnel Zone Plate with a single focal point in accordance with the present disclosure.

The FPZ 38 functions as a lens using diffraction of light rather than refraction of light, which is the case for a standard lens. The use of an FPZ 38 allows the use of a planarized focusing optical element, which facilitates its integration in the chip-scale lidar 10. FIG. 1B shows an example of a single focal point sinusoidal FZP 38. Due to the chip-scale nature of the FZP 38, which may be fabricated using high precision lithography, the focal length of the FZP 38 and its position relative to the photodetector 42 can be accurately controlled.

Figure 2A:
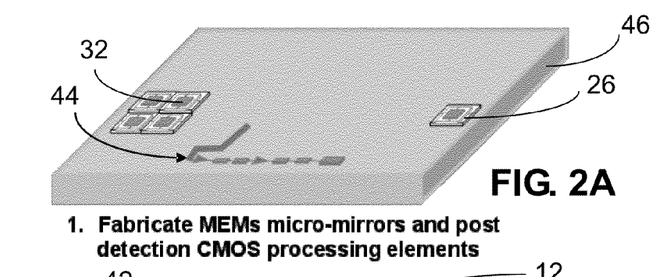
FIGS. 2A, 2B, 2C, 2D, 2E, 2F and 2G show the steps for fabricating a chip-scale scanning lidar in accordance with the present disclosure.

FIGS. 2A, 2B, 2C, 2D, 2E, 2F and 2G show the steps involved in fabricating the chip-scale scanning lidar. The 2D scanning micromirrors 26 and 32, which may be micro-electromechanical system (MEMS) based, as well as the post detection lidar processing circuitry 44, are fabricated on substrate 46 in step 1, as shown in FIG. 2A, using standard processing methods. The substrate 46 may be a large area Si wafer of 8 inch diameter or larger, or other materials as described above.

Figure 2B:
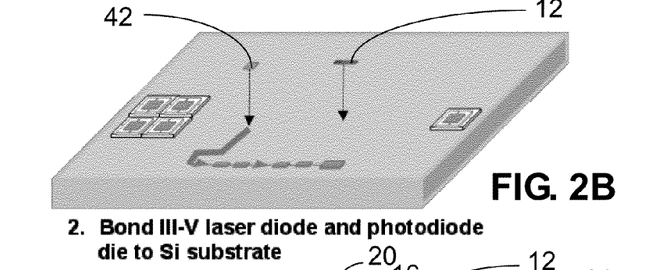

The laser diode die 12 and the photodetector die 42 may be pre-fabricated on their own respective substrate material, and subsequently bonded in step 2, as shown in FIG. 2B, to the lidar host substrate 46 using appropriate die bonding equipment capable of sub-micron alignment accuracy. Alternately, laser diode and photodetector material layers may be first bonded to the host substrate using molecular, adhesive, or compression metal bonding techniques, and then further processed to form the laser diode 12 and photodetector 42.

Figure 2C:
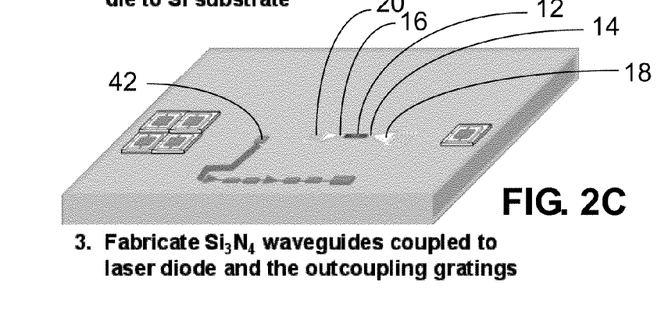

In step 3, as shown in FIG. 2C, the waveguides 14 and 16 and the grating outcoupler structures 18 and 20 are formed on substrate 46 using appropriate material layers transparent at the laser operating wavelength. For example, $Si_3N_4$ and $SiO_2$ can be used as the core and cladding waveguide material in the visible to the LWIR bands, while Si and $SiO_2$ can be used for core/cladding layers in the near-IR (>1.1 □m wavelength) to mid-IR (<8 □m wavelength) bands. The waveguides 14 and 16 can be optically coupled to the laser diode 12 using either butt coupling or evanescent coupling approaches, which are well developed in the art.

Figures 2D, 2E, 2F:
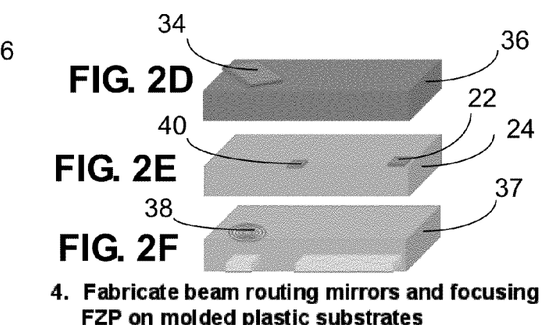
Figure 2G:
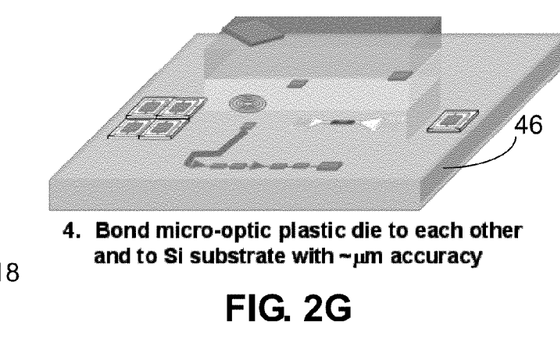

In step 4, as shown in FIGS. 2E and 2G, the fixed micromirrors 22 and 40 are formed in thick dielectric layer 24, which may be plastic, using molding techniques. Similarly, the mirror 34 is formed in thick dielectric layer 36, which may be plastic, using molding techniques, as shown in FIGS. 2D and 2G. The FZP 38, or the microlens, is also formed in a thick dielectric layer 37, which may be plastic, using molding techniques, as shown in FIGS. 2F and 2G. These micro-optical components are formed separately, as shown in FIGS. 2D, 2E and 2F, and then the dielectric layers 24, 36 and 37 are bonded together to form a composite structure. Then the composite structure of the bonded dielectric layers is bonded to the substrate 46 over the laser diode 12, the waveguides 14 and 16, the grating outcouplers 18 and 20, and the photodetector 42, as shown in FIG. 2G. The dielectric layer 37 in the composite structure faces the substrate 46, as shown in FIG. 2G.

Cavities may be formed in the dielectric layer 37 in order to provide space for any vertical extent of the laser diode 12, the waveguides 14 and 16, the grating outcouplers 18 and 20, and the photodetector 42. The alignment of the different dielectric layers 24, 36 and 37 to each other and to the lidar substrate 46 is not critical due to the relatively large sizes of these elements, which have dimensions of a few millimeters. These dimensions are large compared to the dimensions of the other optical elements, such as the laser diode 12 and the photodetector 42, integrated on the substrate 46.

Figure 3A:
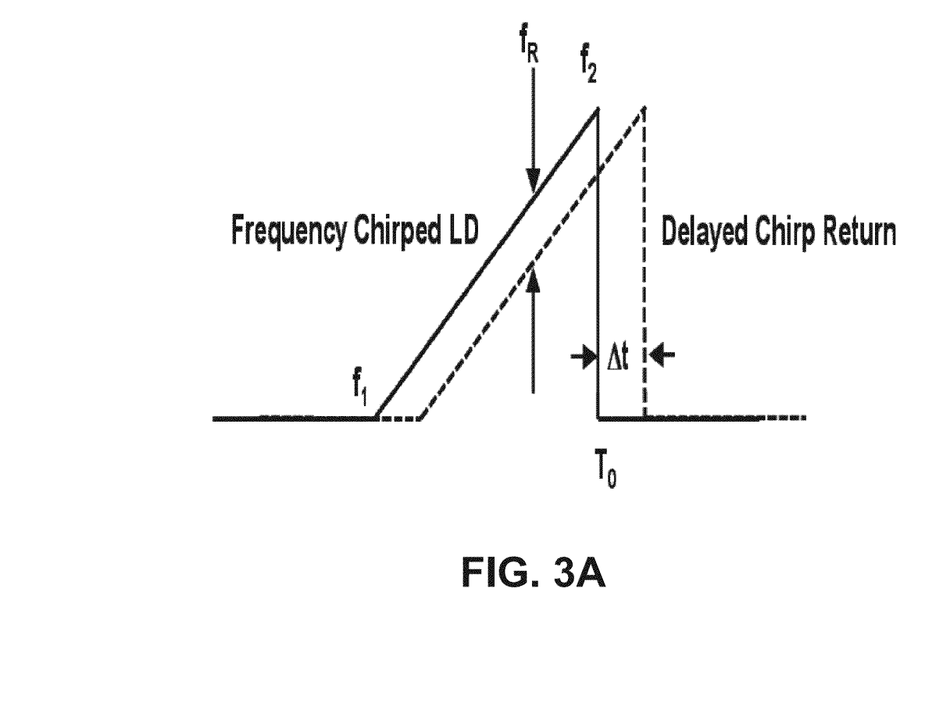
FIG. 3A shows frequency modulation continuous wave (FMCW) and the relationship between the detected range and range resolution.
Figure 3B:
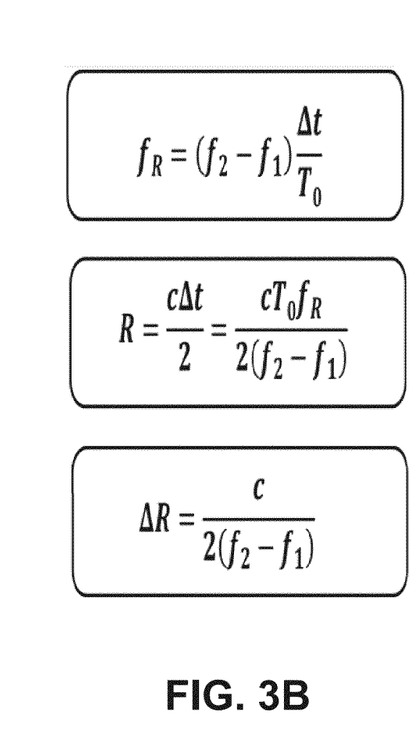
FIG. 3B shows the corresponding equations in accordance with the present disclosure.

The scanning lidar chip 10 may operate in either pulsed or quasi-CW modes. Because the laser diode 12 may have a restricted output power, it is preferable to modulate the optical transmit beam in a frequency modulated continuous wave (FMCW) format. FIG. 3A shows a schematic of the FMCW modulation scheme and the relationship between the detected range and range resolution with the frequency modulation range ($f_2-f_1$) and the frequency ramp duration ($T_0$). FIG. 3B shows the corresponding equations.

Figure 4A:
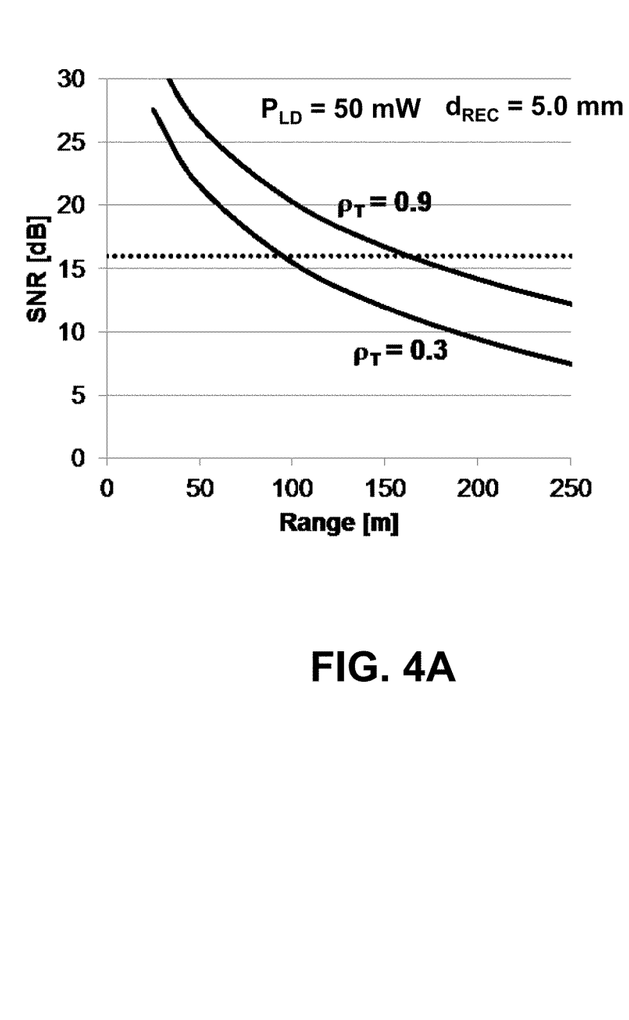
FIGS. 4A and 4B show a simulated signal to noise ratio (SNR) versus range of a scanning coherent FMCW lidar chip for different target reflectivity in accordance with the present disclosure.
Figure 4B:
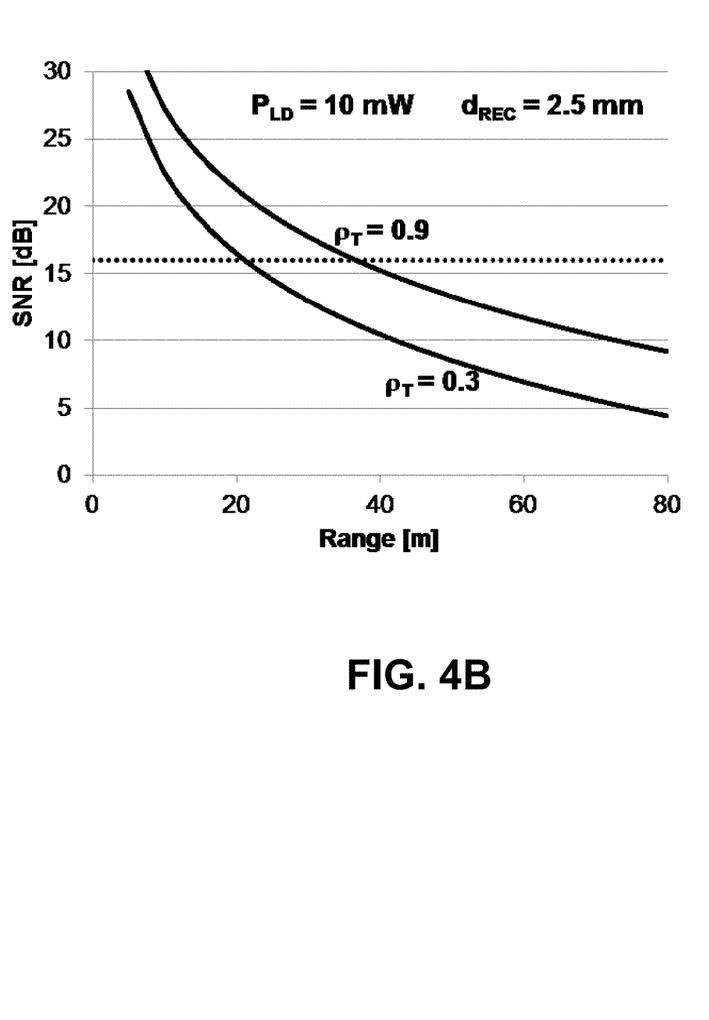

FIGS. 4A and 4B show the predicted performance of a scanning coherent FMCW lidar chip in terms of the signal-to-noise ratio (SNR) of the return signal as a function of lidar range. Two different lidar chips, one with a higher power laser diode, with up to ~50 mW of power, as shown in FIG. 4A, and the other with a lower power laser diode with up to 10 mW of power, as shown in FIG. 4B, are each considered for both specular or diffuse targets. The SNR is based on the known relationship given below:

$$SNR = \frac{P_0 A_{rx} e^{-2\alpha R} \eta_{det} \eta_{lin} \eta_{FM} \eta_{pol} \rho_T}{\pi R^2 \left(\frac{hc}{\lambda}\right) B}$$

where $P_0$ is the laser diode CW optical power,
$A_{rx}$ is the lidar receiver photodetector area,
R is the lidar range,
$\alpha$ is the atmospheric absorption coefficient,
$\eta_{det}$, $\eta_{lin}$, $\eta_{FM}$, and $\eta_{pol}$, are the photodiode efficiency, FMCW linearity coefficient, FMCW efficiency, and depolarization coefficient, respectively,
$\rho_T$ is the target reflectivity,
$\lambda$ is the optical wavelength,
h is Planck's constant, and
B is the detector bandwidth.
The laser diodes both have a linewidth of 400 kHz, which is typical of state-of-the-art DFB and DBR lasers 12. In FIGS. 4A and 4B, values of $\eta_{det}=0.8$, $\eta_{lin}=0.5$, $\eta_{FM}=0.8$, and $\eta_{pol}=0.6$ have been assumed. Furthermore, $\alpha=0.05$ km$^{-1}$ B=0.5 MHz, and $\lambda=1550$ nm are considered.

The lidar chip of FIG. 4A has a total area of 50 mm$^2$ with a receive aperture of 5 mm, while the liar chip of FIG. 4B has a total area of 12 mm$^2$ with a receive aperture of 2.5 mm. In both lidar chips, the 2D scanning micromirror 26 are assumed to have 0.5 mm dimensions, resulting in a transmit beam with a divergence of 0.2° at near-IR wavelengths of 1550 nm that can be scanned in a 120°×60° FOV. The 2D array of scanning micromirrors 32 in the receive section of the lidar each have an identical structure and identical dimensions as that of the single scanning micromirror 26 in the transmit section. The larger chip of FIG. 4A with 50 mW of CW laser power has more than 150 m of range capability at a SNR of 16 dB, with a 90% detection capability and a false alarm probability of $10^{-5}$. On the other hand, the smaller lidar chip of FIG. 4B requires a lower laser power of 10 mW to enable a 35 m range.

The integrated chip-scale scanning lidar transceiver 10 is capable of generating an optical beam with a narrow beamwidth (<0.2°) that can be scanned in two dimensions with a wide field-of-view (120°). Imaging in 3D-range plus a 2D image of targets at short ranges is possible. The advantages of the disclosed concept compared to the state-of-the-art scanning lidar modules are: (1) a factor of >$10^3$ smaller volume, (2) a factor of >$10^2$ less expensive, (3) no external optical alignment required, (4) vibration-resistant, (5) ability to have lower optical power when operating in a quasi-CW mode, compared to pulsed mode operation, and (6) adaptability to different operating wavelengths by changing the laser and photodetector material integrated on the chip. Yet another feature of this scanning lidar concept is the ability to program the micromirrors to scan in optimized 2D patterns to first do a cursory scan of the overall target area, and then selectively focus on the more interesting areas of the target for improved resolution and/or higher signal-to-noise ratio. Furthermore, the compact nature of this chip-scale scanning lidar results in a smaller size, weight and power, which facilitates installation in many commercial and military platforms.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method of fabricating a chip-scale scanning lidar comprising:
   forming a two dimensional (2D) scanning micromirror for a transmit beam on a substrate;
   forming a two dimensional (2D) scanning micromirror for a receive beam on the substrate;
   forming a laser diode on the substrate;
   forming a photodetector on the substrate;
   forming a first waveguide on the substrate connected on one end of the first waveguide to a first facet of the laser diode;
   forming a first grating outcoupler on the substrate connected to another end of the first waveguide;
   forming a second waveguide on the substrate connected on one end of the second waveguide to a second facet of the laser diode;
   forming a second grating outcoupler on the substrate connected to another end of the second waveguide;
   forming a first fixed micromirror and a second fixed micromirror in a first dielectric layer;
   forming a third fixed micromirror in a second dielectric layer;
   forming a focusing component in a third dielectric layer;
   bonding the first, second and third dielectric layers together to form a composite structure;
   aligning the composite structure to the substrate over the laser diode and photodetector; and
   bonding the composite structure to the substrate over the laser diode and photodetector.

2. The method of claim 1:
   wherein forming a laser diode on the substrate comprises:
      fabricating the laser diode on a second substrate; and
      bonding the second substrate to the substrate;
   wherein forming a photodetector on the substrate comprises:
      fabricating the photodetector on a third substrate; and
      bonding the third substrate to the substrate.

3. The method of claim 1 wherein:
   wherein forming a laser diode on the substrate comprises:
      bonding laser diode material layers to the substrate using molecular, adhesive, or compression metal bonding techniques; and
      processing the laser diode material layers to form the laser diode;
   wherein forming a photodetector on the substrate comprises:
      bonding photodetector material layers to the substrate using molecular, adhesive, or compression metal bonding techniques; and
      processing the photodetector material layers to form the laser diode.

4. The method of claim 1 wherein:
   the first waveguide, the second waveguide, the first grating outcoupler, and the second grating outcoupler are formed of material layers transparent at an operating wavelength of the laser diode.

5. The method of claim 4 wherein:
   the material layers comprise $Si_3N_4$ for a core layer and $SiO_2$ for a cladding layer for an operating wavelength of the laser diode in the visible to the LWIR bands, or the material layers comprise Si for a core layer and $SiO_2$ for a cladding layer for an operating wavelength of the laser diode in the near-IR to mid-IR bands.

6. The method of claim 1 wherein:
   forming the first fixed micromirror and the second fixed micromirror in the first dielectric layer comprises molding techniques;
   forming the third fixed micromirror in the second dielectric layer comprises molding techniques; and
   forming the microlens in the third dielectric layer comprises molding techniques.

7. The method of claim 1 further comprising:
   forming cavities in the third dielectric layer to provide space to fit any vertical extent of the laser diode and the photodetector.

8. The method of claim 1 wherein the two dimensional (2D) scanning micromirror for receiving on the substrate comprises an array of 2-dimensional scanning micromirrors.

9. The method of claim 1 wherein:
   the laser diode emits in any spectral band from UV to LWIR; and
   the photodiode is responsive in any spectral band from UV to LWIR.

10. The method of claim 1 wherein:
    light emitted from the second facet of the laser diode is used as the local oscillator for coherent detection of the received beam by the photodetector.

11. The method of claim 1 wherein:
    the laser diode is frequency operates in a pulsed mode, a quasi-continuous wave (CW) mode, or a frequency modulated continuous wave (FMCW) mode.

12. The method of claim 1 further comprising forming post detection lidar processing circuitry on the substrate.

13. The method of claim 1 wherein the focusing component comprises a Fresnel Zone Plate (FZP) or a microlens.

14. The method of claim 1 wherein the laser diode comprises a Distributed Bragg Reflector (DBR) laser or a Distributed Feedback (DFB) laser.

15. The method of claim 1 wherein the 2D scanning micromirror for the receive beam is configured to scan synchronously with the 2D scanning micromirror for the transmit beam.

16. A chip-scale scanning lidar comprising:
    a substrate;
    a two dimensional (2D) scanning micromirror for a transmit beam on the substrate;
    a two dimensional (2D) scanning micromirror for a receive beam on the substrate;
    a laser diode on the substrate;
    a photodetector on the substrate;
    a first waveguide on the substrate connected on one end of the first waveguide to a first facet of the laser diode;
    a first grating outcoupler on the substrate connected to another end of the first waveguide;
    a second waveguide on the substrate connected on one end of the second waveguide to a second facet of the laser diode;
    a second grating outcoupler on the substrate connected to another end of the second waveguide;
    a first fixed micromirror in a dielectric layer, the first fixed micromirror optically coupled to the first grating outcoupler;

a second fixed micromirror in the dielectric layer, the second fixed micromirror optically coupled to the second grating outcoupler;
a third fixed micromirror in the dielectric layer the third fixed micromirror optically coupled to the two dimensional (2D) scanning micromirror for the receive beam; and
a focusing component in the dielectric layer the focusing component optically coupled to the third fixed micromirror;
wherein the photodetector is optically coupled to the second fixed micromirror and the third fixed micromirror for coherent detection; and
wherein the dielectric layer is aligned to and bonded to the substrate over the laser diode and photodetector.

17. The lidar of claim 16 wherein:
the first waveguide, the second waveguide, the first grating outcoupler, and the second grating outcoupler comprise material layers transparent at an operating wavelength of the laser diode.

18. The lidar of claim 17 wherein:
the material layers comprise $Si_3N_4$ for a core layer and $SiO_2$ for a cladding layer for an operating wavelength of the laser diode in the visible to the LWIR bands, or the material layers comprise Si for a core layer and $SiO_2$ for a cladding layer for an operating wavelength of the laser diode in the near-IR to mid-IR bands.

19. The lidar of claim 16 further comprising:
cavities in the dielectric layer to provide space to fit any vertical extent of the laser diode and the photodetector.

20. The lidar of claim 16 wherein the two dimensional (2D) scanning micromirror for receiving on the substrate comprises an array of 2-dimensional scanning micromirrors.

21. The lidar of claim 16 wherein:
the laser diode emits in any spectral band from UV to LWIR; and
the photodiode is responsive in any spectral band from UV to LWIR.

22. The lidar of claim 16 wherein:
the laser diode operates in a pulsed mode, a quasi-continuous wave (CW) mode, or a frequency modulated continuous wave (FMCW) mode.

23. The lidar of claim 16 further comprising post detection lidar processing circuitry on the substrate.

24. The lidar of claim 16 wherein the focusing component comprises a Fresnel Zone Plate (FZP) or a microlens.

25. The lidar of claim 16 wherein the laser diode comprises a Distributed Bragg Reflector (DBR) laser or a Distributed Feedback (DFB) laser.

26. The lidar of claim 16 wherein the 2D scanning micromirror for the receive beam is configured to scan synchronously with the 2D scanning micromirror for the transmit beam.

27. The lidar of claim 16 wherein:
light emitted from the second facet of the laser diode is used as the local oscillator for coherent detection of the received beam by the photodetector.

* * * * *